United States Patent
Cheng et al.

(10) Patent No.: US 8,169,024 B2
(45) Date of Patent: May 1, 2012

(54) METHOD OF FORMING EXTREMELY THIN SEMICONDUCTOR ON INSULATOR (ETSOI) DEVICE WITHOUT ION IMPLANTATION

(75) Inventors: Kangguo Cheng, Albany, NY (US); Bruce B. Doris, Yorktown Heights, NY (US); Pranita Kulkarni, Albany, NY (US); Ghavam Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 12/542,771

(22) Filed: Aug. 18, 2009

(65) Prior Publication Data

US 2011/0042744 A1   Feb. 24, 2011

(51) Int. Cl.
*H01L 29/786* (2006.01)
*H01L 21/336* (2006.01)

(52) U.S. Cl. . 257/347; 257/300; 257/408; 257/E29.286; 257/E29.266; 257/E21.437

(58) Field of Classification Search .................. 257/347, 257/408, E21.415, E21.437, E29.266, E29.286; 438/151, 301
See application file for complete search history.

(56) References Cited

U.S. PATENT DOCUMENTS

2008/0142835 A1* 6/2008 Peidous et al. ............... 257/190
2010/0184265 A1* 7/2010 Maitra et al. ................. 438/303

\* cited by examiner

*Primary Examiner* — Nathan W. Ha
*Assistant Examiner* — Mamadou Diallo
(74) *Attorney, Agent, or Firm* — Scully, Scott, Murphy & Presser, P.C.; Louis J. Percello, Esq.

(57) ABSTRACT

A method of fabricating a semiconductor device is provided in which the channel of the device is present in an extremely thin silicon on insulator (ETSOI) layer, i.e., a silicon containing layer having a thickness of less than 10.0 nm. In one embodiment, the method may begin with providing a substrate having at least a first semiconductor layer overlying a dielectric layer, wherein the first semiconductor layer has a thickness of less than 10.0 nm. A gate structure is formed directly on the first semiconductor layer. A in-situ doped semiconductor material is formed on the first semiconductor layer adjacent to the gate structure. The dopant from the in-situ doped semiconductor material is then diffused into the first semiconductor layer to form extension regions. The method is also applicable to finFET structures.

13 Claims, 6 Drawing Sheets

METHOD OF FORMING EXTREMELY THIN SEMICONDUCTOR ON INSULATOR (ETSOI) DEVICE WITHOUT ION IMPLANTATION

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device. With conventional planar FET scaling reaching fundamental limits, the semiconductor industry is looking at more unconventional geometries that will facilitate continued device performance improvements.

SUMMARY

A method of fabricating a semiconductor device is provided in which the channel of the device is present in an extremely thin semiconductor on insulator (ETSOI) layer, i.e., a semiconductor containing layer having a thickness of less than 10.0 nm. In one embodiment, the method may begin with providing a substrate comprising at least a first semiconductor layer overlying a dielectric layer, wherein the first semiconductor layer has a thickness of less than 10.0 nm. A gate structure is formed directly on the first semiconductor layer. An in-situ doped semiconductor material is formed on the first semiconductor layer adjacent to the gate structure. The dopant from the in-situ doped semiconductor material is diffused into the first semiconductor layer to form extension regions.

In another aspect, a planar semiconductor device is provided that includes a substrate having a layer of semiconductor material atop an insulating layer, wherein the layer of semiconductor material has at thickness of less than 10.0 nm. A gate structure is present on the layer of semiconductor material. The planar semiconductor device includes doped epitaxial raised source and drain regions that are present atop the layer of semiconductor material and on opposing sides of the gate structure. Extension diffusions are present extending from the doped epitaxial raised source and drain regions into the layer of semiconductor material.

In another embodiment, a method of fabricating a semiconductor device is provided that includes providing a fin structure having a width of less than 20 nm, wherein a dielectric fin cap is present on an upper surface of the fin structure and sidewalls of the fin structure are exposed. A gate structure is formed atop a portion of the fin structure, where a remaining portion of the sidewalls of the fin structure is exposed.

In-situ doped semiconductor material is formed on the exposed sidewalls of the fin structure. The dopants from the in-situ doped semiconductor material diffuse into the fin structure to form extension regions.

In another aspect, a finFET semiconductor device is provided that includes a fin structure having a width of less than 20 nm. A gate structure is present atop a portion of the fin structure. A dielectric spacer is present in direct contact with the gate structure. The finFET semiconductor device further includes doped epitaxial source and drain regions that are present in direct contact with the sidewalls of the fin structure and in direct contact with the dielectric spacer. Extension diffusions extend from the doped epitaxial source and drain regions into the fin structure.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
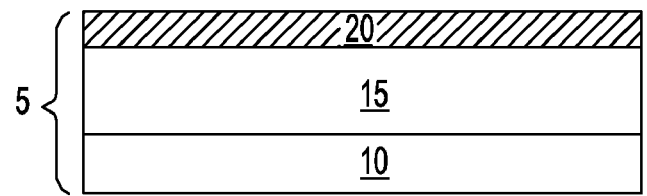
FIG. 1 is a side cross-sectional view depicting providing a substrate comprising at least a first semiconductor layer atop a dielectric layer, wherein the first semiconductor layer has a thickness of less than 10 nm, as used in one embodiment of a method for forming a planar semiconductor device, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method for forming a planar semiconductor device on a semiconductor on insulator (SOI) substrate having an extremely thin semiconductor on insulator (ETSOI) layer. An extremely thin semiconductor on insulator (ETSOI) layer is the semiconductor layer that is present atop the buried insulating layer of an SOI substrate, wherein the ETSOI layer has a thickness of 10 nm or less. In accordance with the present method, source and drain extension regions are formed in the ETSOI layer using an in situ doped epitaxial growth process followed by an annealing process to drive the dopant from the in-situ doped epitaxial semiconductor material into the ETSOI layer to provide extension regions without utilizing ion implantation. In another embodiment, a method is provided for forming a finFET structure without using ion implantation. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein a "field effect transistor" is a transistor in which output current, i.e., source-drain current, is controlled by the voltage applied to the gate. A field effect transistor has three terminals, i.e., gate, source and drain.

As used herein, the term "conductivity type" denotes a dopant region being p-type or n-type.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor In a silicon containing substrate examples of n-type dopants, i.e., impurities, include but are not limited to antimony, arsenic and phosphorous.

A "gate structure" means a structure used to control output current (i.e., flow of carriers in the channel) of a semiconducting device through electrical or magnetic fields.

As used herein, a "gate dielectric" is a layer of an insulator between the semiconductor device substrate of a planar device, or fin structure, and the gate conductor.

A "gate conductor" means a conductive structure of the gate structure on the gate dielectric.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

As used herein, the term "raised" in combination with source and/or drain denotes that the source and/or drain region is formed on a semiconductor material layer that is present on an upper surface of the substrate on which the gate dielectric is present.

As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

As used herein, an "anisotropic etch process" denotes a material removal process in which the etch rate in the direction normal to the surface to be etched is greater than in the direction parallel to the surface to be etched.

As used herein, the term "selective" in reference to a material removal process denotes that the rate of material removal for a first material is greater than the rate of removal for at least another material of the structure to which the material removal process is being applied.

"Epitaxial growth and/or deposition" means the growth of a semiconductor material on a deposition surface of a semiconductor material, in which the semiconductor material being grown has the same crystalline characteristics as the semiconductor material of the deposition surface.

The term "Si:C" or "carbon-doped silicon" as used herein refers to silicon having substitutional carbon atoms located therein. The substitutional carbon atoms and the silicon atoms form a silicon-carbon alloy, which is a semiconductor material.

As used herein, the terms "insulating" and "dielectric" denote a material having a room temperature conductivity of less than about $10^{-10}$ $(\Omega\text{-m})^{-1}$.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

FIGS. 1-4 depict one embodiment of a method of forming a semiconductor device on semiconductor layer, i.e., first semiconductor layer 20, having a thickness of less than 10 nm, in which the method does not use ion implantation to provide the source and drain regions and the extensions regions 45 of the semiconductor device. It has been determined that when implanting dopants into semiconductor layers that have a thickness of 10 nm or less that the ion implantation amorphizes the semiconductor layer. Recrystallizing the amorphous semiconductor layer is difficult, because of the limited amount of crystal seed layer that is available in semiconductor layers having a thickness of less than 10 nm that have been ion implanted into an amorphous crystal structure. The presence of an amorphous semiconductor material in a semiconductor device results in the semiconductor device having a high external resistance. Further, the resistance of the semiconductor device is increased by defects in the semiconductor layer that are produced by ion implantation. The ion implantation may also damage the gate dielectric. In one embodiment, the method disclosed herein overcomes the disadvantages that result from ion implantation, by forming the source and drain regions in an ETSOI layer, i.e., first semiconductor layer 20, using an in-situ doped epitaxial semiconductor growth process followed by an annealing process. The annealing process drives the dopant from the in-situ doped epitaxial semiconductor material 21, i.e., in-situ doped epitaxial semiconductor raised source and drain regions, into the first semiconductor layer 20 to provide extension regions 45.

FIG. 1 illustrates the results of the initial processing steps that produce a substrate 5, i.e., semiconductor on insulator (SOI) substrate, in which a substrate 5 comprises at least a first semiconductor layer 20 (hereafter referred to as an ETSOI layer 20) overlying a dielectric layer 15, wherein the ETSOI layer 20 has a thickness of less than 10 nm. A second semiconductor layer 10 may be present underlying the dielectric layer 15.

The ETSOI layer 20 may comprise any semiconducting material including, but not limited to Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. One method of thinning the ETSOI layer 20 is to oxidize the Si by a thermal dry or wet oxidation process, and then wet etch the oxide layer using a hydrofluoric acid mixture. This process can be repeated to achieve the desired thickness. In one embodiment, the ETSOI layer 20 has a thickness ranging from 1.0 nm to 10.0 nm. In another embodiment, the ETSOI layer 20 has a thickness ranging from 1.0 nm to 5.0 nm. In a further embodiment, the ETSOI layer 20 has a thickness ranging from 3.0 nm to 8.0 nm. The second semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The dielectric layer 15 that may be present underlying the ETSOI layer 20 and atop the second semiconductor layer 10 may be formed by implanting a high-energy dopant into the substrate 5 and then annealing the structure to form a buried insulating layer, i.e., dielectric layer 15. In another embodiment, the dielectric layer 15 may be deposited or grown prior to the formation of the ETSOI layer 20. In yet another embodiment, the substrate 5 may be formed using wafer-bonding techniques, where a bonded wafer pair is formed utilizing glue, adhesive polymer, or direct bonding.

Figure 2:
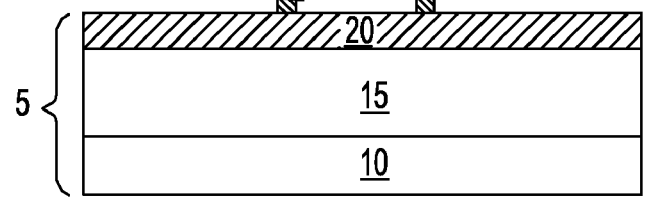
FIG. 2 is a side cross-sectional view depicting forming a gate structure directly on the first semiconductor layer, in accordance with one embodiment of the present invention.

FIG. 2 depicts forming a gate structure 6 directly on the first semiconductor layer, in accordance with one embodiment of the present invention. The gate structure 6 can be formed using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap 4) may be used to form the gate structure 6. The dielectric cap 4 may be formed by first depositing a dielectric hard mask material, like SiN or $SiO_2$, atop a layer of gate electrode material and then applying a photoresist pattern to the hard mask material using a lithography process steps. The photoresist pattern is then transferred into the hard mask material using a dry etch process forming the dielectric cap 4. Next the photoresist pattern is removed and the dielectric cap 4 pattern is then transferred into the gate electrode material during a selective etching process. The dielectric cap 4 may be removed by a wet or dry etch prior to the silicidation process. Alternatively, the first and second gate structure 6 can be formed by other patterning techniques such as spacer image transfer.

The gate structure 6 may include at least a gate conductor atop a gate dielectric 9. Gate conductor may be a metal gate electrode 3. The metal gate electrode 3 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate structure may further include a second conductive material 8 atop the metal gate electrode 3. In one example, the second conductive material 8 may be a doped semiconductor material, such as a doped silicon containing material, e.g., doped polysilicon. When a combination of conductive elements is employed, an optional diffusion barrier material such as TaN or WN may be formed between the conductive materials. The gate conductor of the gate structure is typically present on a gate dielectric 9. The gate dielectric 9 may be a dielectric material, such as $SiO_2$, or alternatively high-k dielectrics, such as oxides of Ta, Zr, Al or combinations thereof. In another embodiment, the gate dielectric 9 is comprised of an oxide, such as $SiO_2$, $ZrO_2$, $Ta_2O_5$ or $Al_2O_3$. In one embodiment, the gate dielectric 9 has a thickness ranging from 1 nm to 10 nm. In another embodiment, the gate dielectric 9 has a thickness ranging from 1.5 nm to 2.5 nm.

A set of first spacers 11 can be formed in direct contact with the sidewalls of the gate structure 6. The first spacers 11 are typically narrow having a width ranging from 2.0 nm to 15.0 nm. The first spacer 11 can be formed using deposition and etch processing steps. The first spacer 11 may be composed of a dielectric, such as nitride, oxide, oxynitride, or a combination thereof. The thickness of the first spacer 11 determines the proximity of the subsequently formed raised source/drain (RSD) regions to the channel of the device.

Figure 3:
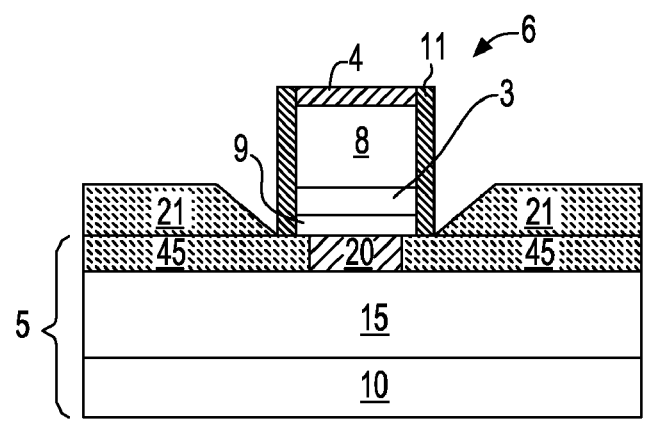
FIG. 3 is a side cross-sectional view depicting forming an in-situ doped semiconductor material on the first semiconductor layer adjacent to the gate structure, in accordance with one embodiment of the present invention.

FIG. 3 depicts one embodiment of forming an in-situ doped semiconductor material 21 on exposed surfaces of the ETSOI layer 20 that are adjacent to the gate structure 6. In one embodiment, the in-situ doped semiconductor material 21 is formed using an epitaxial growth process. When the chemical reactants are controlled and the system parameters set correctly, the depositing atoms arrive at the surface of the ETSOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although higher temperature typically results in faster deposition, the faster deposition may result in crystal defects and film cracking.

In one embodiment, the in-situ doped semiconductor material 21 may be provided by selective-epitaxial growth of SiGe atop the ETSOI layer 20. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in the portion of the ETSOI layer 20, in which the channel of a semiconductor device, such as a pFET device, is subsequently formed.

In one embodiment, the in-situ doped semiconductor material 21 is doped with a first conductivity type dopant during the epitaxial growth process. In one embodiment, the in-situ doped semiconductor material 21 provides the raised source and drain regions of a semiconductor device, P-type MOSFET devices are produced by doping the in-situ doped semiconductor material 21 with elements from group III of the Periodic Table of Elements. In one embodiment, the group III element is boron, aluminum, gallium or indium. In one example, in which the in-situ doped semiconductor material 21 is doped to provide a p-type conductivity, the dopant may be boron present in a concentration ranging from $1 \times 10^{18}$ atoms/cm$^3$ to $2 \times 10^{21}$ atoms/cm$^3$. In one example, the in-situ doped semiconductor material 21 is composed of SiGe and is doped with boron to provide the raised source and drain regions of a p-type conductivity field effect transistor.

In another embodiment, the in-situ doped semiconductor material 21 is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the ETSOI layer 20, in which the channel of a semiconductor device, such as a nFET device, is subsequently formed.

In one embodiment, the in-situ doped semiconductor material 21 is doped with a second conductivity type dopant during the epitaxial growth process. In one embodiment, the in-situ semiconductor material 21 provides the raised source and drain regions of a semiconductor device, in which n-type MOSFET devices are produced by doping the in-situ doped semiconductor material 21 with elements from group V of the Periodic Table of Elements. In one embodiment, the group V element is phosphorus, antimony or arsenic.

Figure 4:
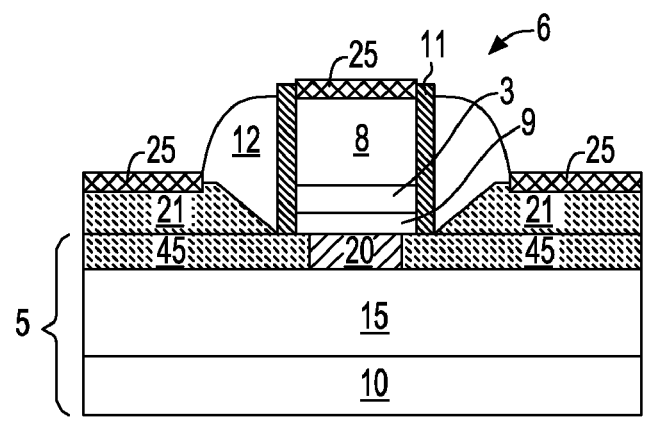
FIG. 4 is a side cross-sectional view depicting diffusing dopant from the in-situ doped semiconductor material into the first semiconductor layer to form extension regions, in accordance with one embodiment of the present invention.

FIG. 4 depicts one embodiment of diffusing dopant from the in-situ doped semiconductor material 21 into the ETSOI layer 20 to form extension regions 45. In one embodiment, the dopant from the in-situ doped semiconductor material 21 is diffused into the ETSOI layer 20 by an annealing processes including, but not limited to: rapid thermal annealing, furnace annealing, flash lamp annealing, laser annealing, or any suitable combination of thereof. In one embodiment, thermal annealing to diffuse the dopant from the in-situ doped semiconductor material 21 into the ETSOI layer 20 is conducted at a temperature ranging from about 850° C. to about 1350° C.

In one embodiment, in which in-situ doped semiconductor material 21 is doped to a p-type conductivity, the extension regions 45 that are formed in the ETSOI layer 20 have a p-type conductivity. Typically, the dopant concentration of the extension regions 45 having the p-type conductivity ranges from $1 \times 10^{19}$ atoms/cm$^3$ to $2 \times 10^{21}$ atoms/cm$^3$. In another embodiment, the extension regions 45 have the p-type conductivity ranging from $2 \times 10^{19}$ atoms/cm$^3$ to $5 \times 10^{20}$ atoms/cm$^3$.

In another embodiment, in which the in-situ doped semiconductor material 21 is doped to an n-type conductivity, the extension regions 45 that are formed in the ETSOI layer 45 have an n-type conductivity. Typically, the dopant concentration of the extension regions 45 having the n-type conductivity ranges from $1 \times 10^{19}$ atoms/cm$^3$ to $2 \times 10^{21}$ atoms/cm$^3$. In another embodiment, the extension regions 45 have the p-type conductivity ranging from $2 \times 10^{19}$ atoms/m$^3$ to $5 \times 10^{20}$ atoms/cm$^3$.

In one embodiment, the extension regions 45 have a depth that extends the entire depth of the ETSOI layer 20. Therefore, the extension regions 45 have a depth of less than 10 nm, typically being 3 nm to 8 nm in depth, as measured from the upper surface of the ETSOI layer 20.

FIG. 4 depicts removing the dielectric cap 4 from the gate structure 6 and forming a second spacer 12 in direct contact with the first spacer 11. The dielectric cap 4 may be removed using a selective etch process. The width of the second spacers 12 is selected to ensure that subsequent silicidation processes do not result in a silicide bridge from the contacts to the raised source and drain regions provided by the in-situ doped semiconductor material 21 to the conductive features of the gate structure 6. The second spacers 12 may be formed by depositing a conformal dielectric film and using a highly directional dry etch process. The second spacers 12 may be composed of a dielectric such as a nitride, oxide, oxynitride, high-k dielectric, or a combination thereof.

Silicides 25 are then formed on the raised source and drain regions of the device, i.e., the in-situ doped semiconductor material 21. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining unreacted metal is removed by an etch process selective to silicides 25 and spacers 12. A gate silicide may also be formed on the gate conductor.

Following silicide formation, a layer of dielectric material can be blanket deposited atop the entire substrate and planarized. The blanket dielectric may be selected from the group consisting of silicon-containing materials such as SiO$_2$, Si$_3$N$_4$, SiO$_x$N$_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable. The deposited dielectric is then patterned and etched to form via holes to the various source/drain and gate conductor regions of the device. Following via formation interconnects are formed by depositing a conductive metal into the via holes using deposition methods, such as CVD or plating. The conductive metal may include, but is not limited to: tungsten, copper, aluminum, silver, gold and alloys thereof.

Referring to FIG. 4, the above process may provide a planar semiconductor device that includes a substrate 5 having a layer of semiconductor material (ETSOI layer 20) atop an insulating layer 15, wherein the layer of semiconductor material has at thickness of less than 10.0 nm. A gate structure 6 is present on the semiconductor material. The planar semiconductor device includes doped epitaxial raised source and drain regions (in-situ doped semiconductor material 21) that are present atop the semiconductor material, and extension diffusions (extension regions 45) extending from the doped epitaxial raised source and drain regions into the semiconductor material.

FIGS. 5-9B depict one embodiment of a method of fabricating a finFET semiconductor device having a fin structure 200 with a width W1 of less than 20 nm, in which the method does not use ion implantation to provide the source and drain regions (in-situ doped epitaxial semiconductor material 210) and the extensions regions 45 of the device. FinFET formation typically requires ion implantation to form source and drain extension regions. Ion implantation typically tends to amorphize the entire fin structure and generates implant-related defects. It is difficult to recrystallize the amorphous semiconductor and to eliminate implant defects during the subsequent low thermal budget anneal process that are typically utilized in finFET manufacturing. In one embodiment, the method disclosed herein overcomes the disadvantages that result from ion implantation by forming the source and drain extensions in the fin structure using an in-situ doped epitaxial growth process followed by an annealing process, wherein the annealing process drives the dopant into the fin structure to form extension regions.

Figure 5:
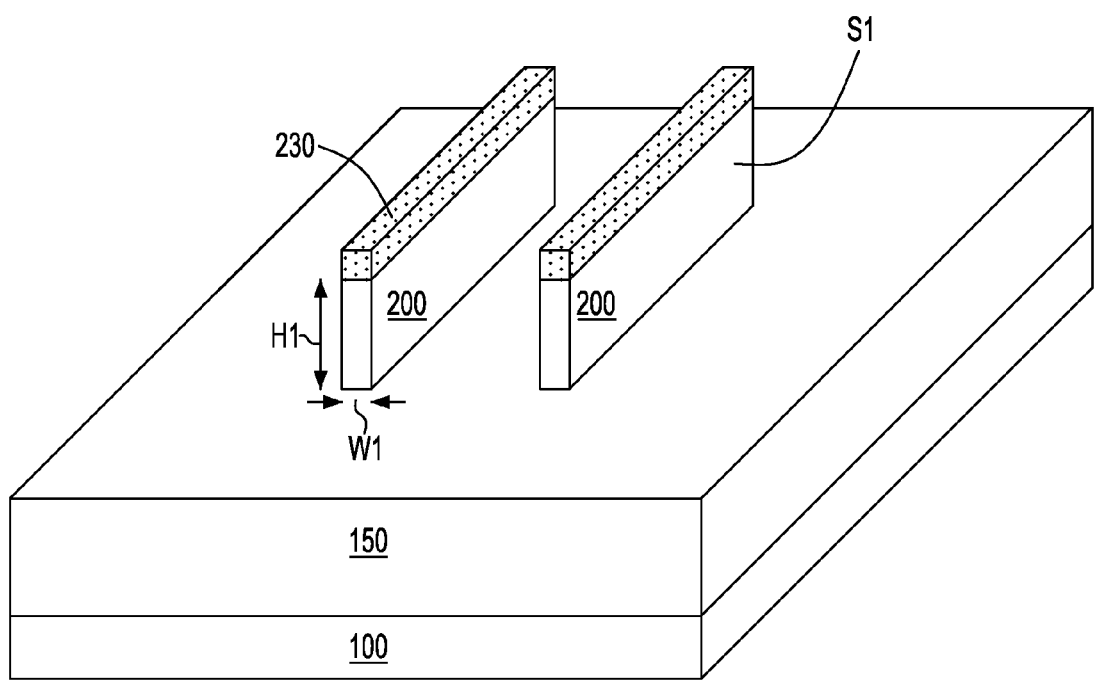
FIG. 5 is a perspective view depicting a fin structure having a width of less than 20 nm, wherein a dielectric fin cap is present on an upper surface of the fin structure and sidewalls of the fin structure are exposed, as used in one embodiment of a method for forming a finFETs device, in accordance with the present invention.

FIG. 5 depicts an initial structure used in one embodiment of a method for forming a finFET device. The initial structure may include a fin structure 200 present atop a dielectric layer 150. In one embodiment, a dielectric fin cap 230 may be optionally present on the fin structure 200. In one embodiment, the fin structure 200 and the dielectric layer 150 may be provided from an SOI substrate, in which the top semiconductor layer of the SOI substrate provides the fin structure 200. The SOI substrate typically includes a bottom semiconductor layer 100 and a top semiconductor layer 200 (hereafter referred to as an SOI layer 200) that are electrically isolated from each other by a buried insulating layer (hereafter referred to as a dielectric layer 150). The SOI layer 200 and the bottom semiconductor layer 100 may comprise at least one of Si, Ge alloys, SiGe, GaAs, InAs, InP, SiCGe, SiC as well as other III/V or II/VI compound semiconductors. The SOI layer 200 and bottom semiconductor layer 100 may comprise the same or different materials.

The dielectric layer 150 separating the SOI layer 200 and the bottom semiconductor layer 100 may be a crystalline or non-crystalline oxide, nitride, oxynitride, or any other insulating material. The SOI substrate employed in the present invention may be formed utilizing a layer transfer process including a bonding step. Alternatively, an implantation process such as SIMOX (Separation by IMplantation of OXygen) can be used in forming the SOI substrate.

The thickness of the various layers of the SOI substrate may vary depending on the technique used in forming the same. In one embodiment, the SOI layer 200 has a thickness ranging from 3 nm to 100 nm, the dielectric layer 200 (also referred to as buried dielectric layer) has a thickness ranging from 10 nm to 150 nm, and the thickness of the bottom semiconductor layer 100 of the SOI substrate may range from 10 nm to 500 nm.

It is noted that although an SOI substrate is depicted and described in the following discussion, embodiments of the present invention are contemplated that utilize a bulk semiconductor substrate. In one example of the present invention, in which a bulk semiconductor substrate is used, the bulk semiconductor substrate comprises at least one of Si, Ge alloys, SiGe, GaAs, InAs, InP, SiCGe, SiC as well as other III/V or II/VI compound semiconductors.

In one embodiment, prior to etching the SOI substrate to provide the fin structure 200, a layer of the dielectric material that provides the dielectric fin cap 230 is deposited atop the SOI substrate. The dielectric fin cap 230 may be composed of a nitride, oxide, oxynitride material, and/or any other suitable dielectric layer. The dielectric fin cap 230 may comprise a single layer of dielectric material or multiple layers of dielectric materials. The dielectric fin cap 230 can be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed.

Alternatively, the dielectric fin cap 230 may be formed using a growth process, such as thermal oxidation or thermal nitridation. The dielectric fin cap 230 may have a thickness ranging from 1 nm to 100 nm. In one embodiment, the dielectric fin cap 230 is composed of an oxide, such as $SiO_2$, that is formed by chemical vapor deposition to a thickness on the order of 25 nm to 50 nm. In yet another embodiment, no dielectric fin cap 230 is present.

In one embodiment, following the formation of the layer of dielectric material that provides the dielectric fin cap 230, a photolithography and etch process sequence applied to the dielectric fin cap 230 and the SOI substrate may provide the initial structure that is depicted in FIG. 5. Specifically, in one example, a photoresist mask is formed overlying the layer of the dielectric material that provides dielectric fin cap 230 and is present overlying the SOI layer 200 of the substrate, in which the portion of the dielectric material that is underlying the photoresist mask provides the dielectric fin cap 230, and the portion of the SOI layer 200 that is underlying the photoresist mask provides the fin structure 200. The exposed portions of the dielectric material that provides dielectric fin cap 230 and the SOI layer 200, which are not protected by the photoresist mask, are removed using a selective etch process. To provide the photoresist mask, a photoresist layer is first positioned on the layer of the dielectric material that provides dielectric fin cap 230. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 230 followed by removing the unprotected portion of the SOI layer 200 selective to the underlying buried insulating layer, i.e., dielectric layer 150. For example, the transferring of the pattern provided by the photoresist into the underlying structures may include an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structure 200 can be formed by spacer imaging transfer technique well-known in the art.

The fin structure 200 may have a height $H_1$ ranging from 5 nm to 200 nm. In one embodiment, the fin structure 200 has a height $H_1$ ranging from 10 nm to 100 nm. In another embodiment, the fin structure 200 has a height $H_1$ ranging from 20 nm to 50 nm. In one embodiment, the fin structure 200 has a width $W_1$ of less than 20 nm. In another embodiment, the fin structure 200 has a width $W_1$ ranging from 3 nm to 8 nm.

Figure 6:
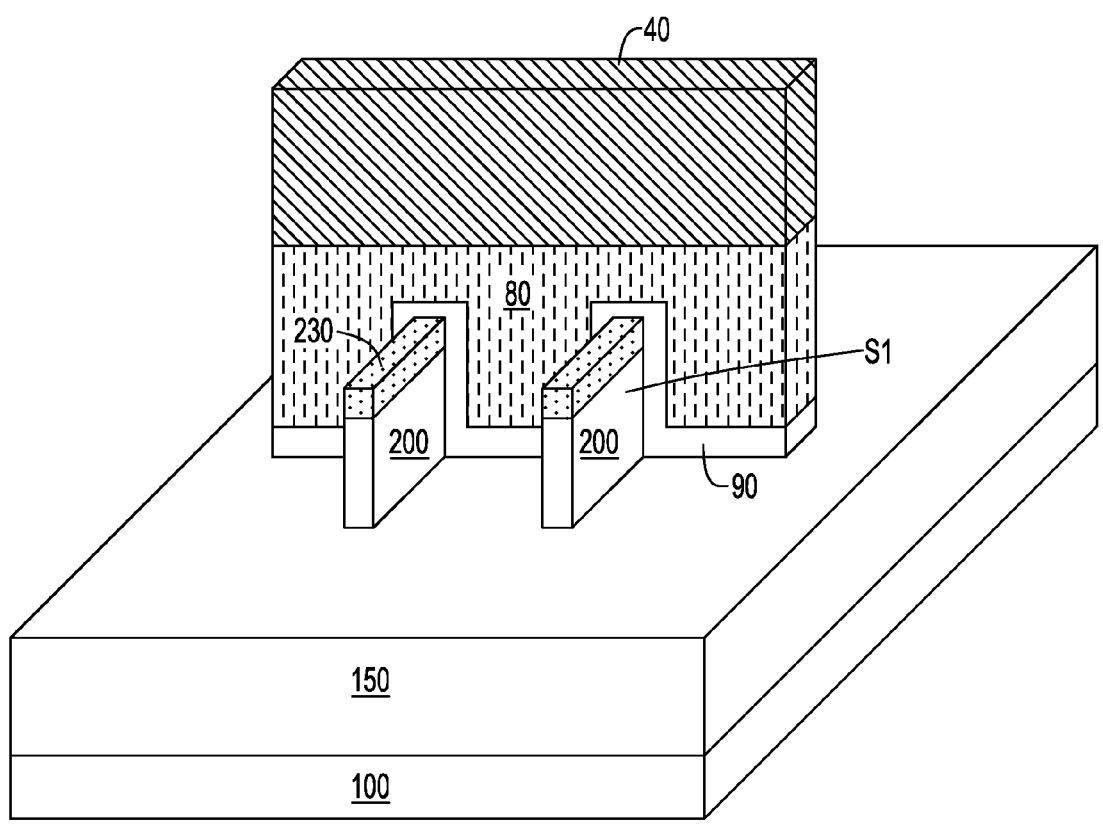
FIG. 6 is a perspective view depicting forming a gate structure atop a portion of the fin structure, wherein a remaining portion of the sidewalls of the fin structure are exposed, in accordance with one embodiment of the present invention.

FIG. 6 depicts forming a gate structure 60 on the fin structure 200 and the dielectric fin cap 230. In one embodiment, the gate structure 60 includes a gate dielectric 90 in contact with at least the fin structure 200, a gate conductor 80 on the gate dielectric 90, and a gate dielectric cap 40 on the gate conductor 80. The gate structure 60 may be formed by forming blanket material layers for the gate dielectric 90, gate conductor 80, and gate dielectric cap 40 to provide a gate stack, and patterning and etching the gate stack to provide the gate structure 60. The gate structure 60 can be formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. In one embodiment, the portion of the gate stack that is removed to provide the gate structure 60 exposes the sidewalls S1 of the fin structure 220.

The gate dielectric 90 is typically positioned on at least a portion of the sidewalls S1 of the fin structure 200. The gate dielectric 90 may be formed by a thermal growth process such as, for example, oxidation, nitridation or oxynitridation. The gate dielectric 90 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the gate dielectric 90 is deposited using a conformal deposition process. The term "conformal" denotes a layer having a thickness that does not deviate from greater than or less than 20% of an average value for the thickness of the layer. The gate dielectric 90 may also be formed utilizing any combination of the above processes.

The gate dielectric 90 may be comprised of an insulating material having a dielectric constant of 4.0 or greater. In another embodiment, the gate dielectric 90 is comprised of an insulating material having a dielectric constant greater than 7.0. The dielectric constants mentioned herein are relative to a vacuum at room temperature. In one embodiment, the gate dielectric 90 employed in the present invention includes, but is not limited to: an oxide, nitride, oxynitride and/or silicates including metal silicates, aluminates, titanates and nitrides. In one example, when the gate dielectric 90 is comprised of an oxide, the oxide may be selected from the group including, but not limited to $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 90 may vary, but typically, the gate dielectric 90 has a thickness ranging from 1 nm to 10 nm. In another embodiment, the gate dielectric 90 has a thickness ranging from 1 nm to 3 nm.

After forming the gate dielectric 90, the gate conductor 80 of the gate structure 60 is formed on the gate dielectric 90 utilizing a deposition process, such as physical vapor deposition (PVD), CVD or evaporation. The gate conductor 80 may be composed of polysilicon, SiGe, a silicide, a metal or a metal-silicon-nitride, such as Ta—Si—N. Examples of metals that can be used as the gate conductor 80 include, but are not limited to Al, W, Cu, Ti or other like conductive metals. In one embodiment, the gate conductor 80 comprises Ti, Zr, Hf, V, Nb, Ta, TiN, TaN or a combination thereof. The gate conductor 80 may be doped or undoped. The physical thickness of the gate conductor 80 may range from 1 nm to 10 nm. In another embodiment, the gate conductor 80 has a thickness ranging from 1 nm to 3 nm.

The gate dielectric cap 40 may be composed of a nitride, oxide, oxynitride material, and/or any other suitable dielectric layer. Gate dielectric cap 40 may comprise a single layer of dielectric material or multiple layers of dielectric materials. The dielectric layer can be formed by a deposition process, such as chemical vapor deposition (CVD) and/or atomic layer deposition (ALD). Alternatively, the gate dielectric cap 40 may be formed using a growth process, such as thermal oxidation or thermal nitridation. The gate dielectric cap 40 may have a thickness ranging from 1 nm to 100 nm. In one embodiment, the gate dielectric cap 40 is composed of a nitride, such as SiN, that is formed by chemical vapor deposition to a thickness on the order of 25 nm to 50 nm.

Figure 7:
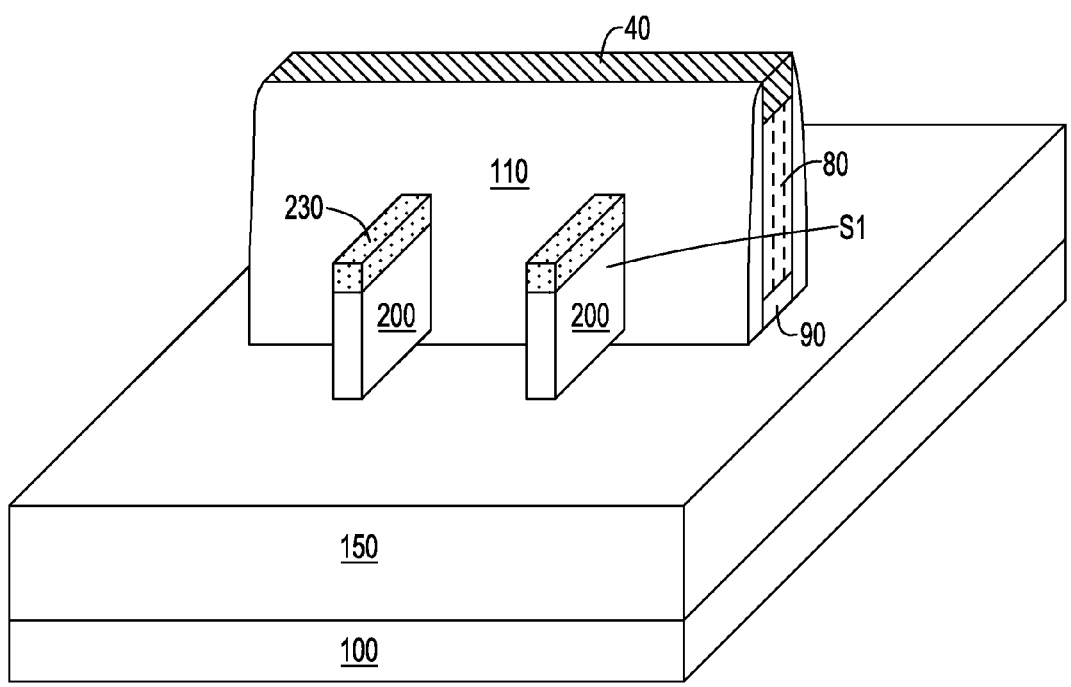
FIG. 7 is a perspective view depicting forming a dielectric spacer in direct contact with the gate structure, in accordance with one embodiment of the present invention.

FIG. 7 depicts forming a first spacer 110 in direct contact with the gate structure 60. The first spacer 110 may be formed by depositing a conformal layer of dielectric material, such as oxides, nitrides or oxynitrides. In one embodiment, the etching process is an anisotropic etching process, such as reactive ion etch. The first spacer 110 may have a width ranging from 1 nm to 10 nm, typically ranging from 1 nm to 5 nm.

Figure 8:
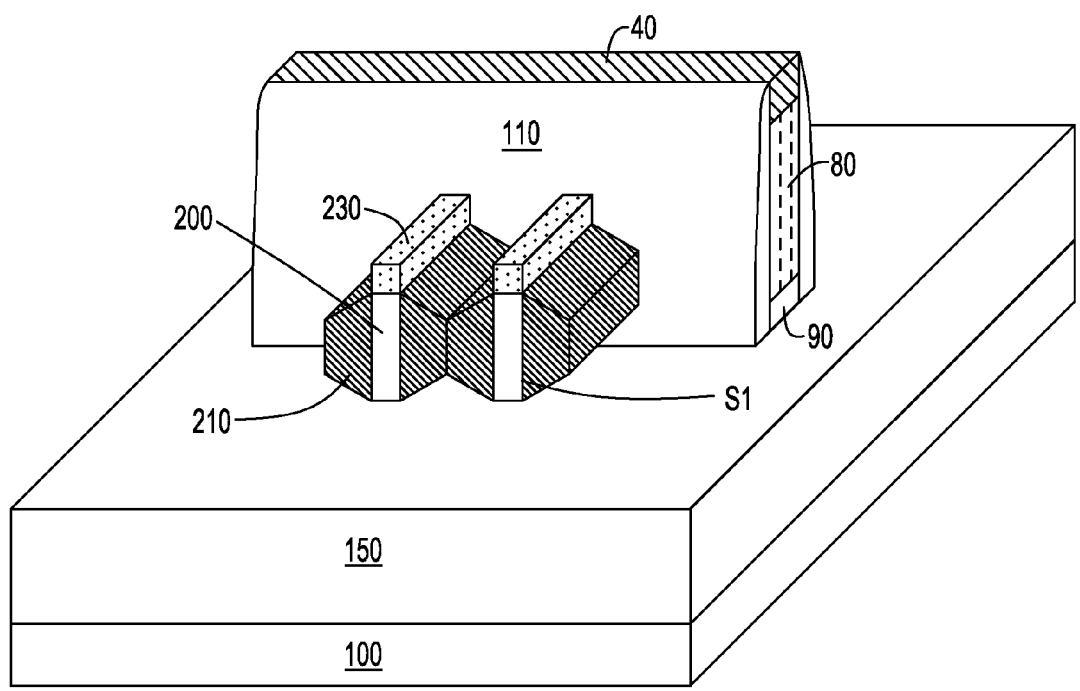
FIG. 8 is a perspective view depicting forming in-situ doped semiconductor material on the exposed sidewalls of the fin structure, in accordance with one embodiment of the present invention.

FIG. 8 depicts forming in-situ doped semiconductor material 210 on the sidewalls S1 of the fin structure 200 that are exposed. In one embodiment, in-situ doped semiconductor material 210 is formed using an epitaxial growth process. A number of different sources may be used for the deposition of epitaxial silicon. Silicon sources for epitaxial growth include silicon tetrachloride, dichlorosilane ($SiH_2Cl_2$), and silane ($SiH_4$).

In one embodiment, the in-situ doped semiconductor material 210 may be provided by selective-epitaxial growth of SiGe on the exposed sidewalls S1 of the fin structure 200. The Ge content of the epitaxial grown SiGe may range from 5% to 70%, by atomic weight %. In another embodiment, the Ge content of the epitaxial grown SiGe may range from 10% to 45%. In one embodiment, the epitaxial grown SiGe produces a compressive strain in the portion of the fin structure 200, in which the channel of a semiconductor device, such as a p-type conductivity finFET, is subsequently formed.

In one embodiment, in-situ doped semiconductor material 210 is doped with a first conductivity type dopant during the epitaxial growth process. In one embodiment, the in-situ doped semiconductor material 210 provides the source and drain regions of a finFET device. P-type finFET devices are produced by doping the in-situ doped semiconductor material 210 with elements from group III of the Periodic Table of Elements. In one embodiment, the group III element is boron, aluminum, gallium or indium. In one example, in which the in-situ doped semiconductor material 210 is doped to provide a p-type conductivity, the dopant may be boron present in a concentration ranging from $1\times10^{19}$ atoms/$cm^3$ to $2\times10^{21}$ atoms/$cm^3$. In one example, the in-situ doped semiconductor material 210 is composed of SiGe and is doped with boron to provide the raised source and drain regions of a p-type conductivity finFET.

In another embodiment, the in-situ doped semiconductor material 210 is composed of epitaxially grown Si:C or carbon doped silicon. The carbon (C) content of the epitaxial grown Si:C ranges from 0.5% to 10%, by atomic weight %. In another embodiment, the carbon (C) content of the epitaxial grown Si:C may range from 1% to 2%. In one embodiment, the epitaxial grown Si:C produces a tensile strain in the portion of the fin structure 200, in which the channel of a semiconductor device, such as an n-type conductivity finFET, is subsequently formed.

In one embodiment, the in-situ doped semiconductor material 21 is doped with a second conductivity type dopant during the epitaxial growth process. In one embodiment, the in-situ semiconductor material 21 provides the source and drain regions of a finFET device. N-type finFET devices are produced by doping the in-situ doped semiconductor material 21 with elements from group V of the Periodic Table of Elements. In one embodiment, the group V element is phosphorus, antimony or arsenic.

Figure 9A:
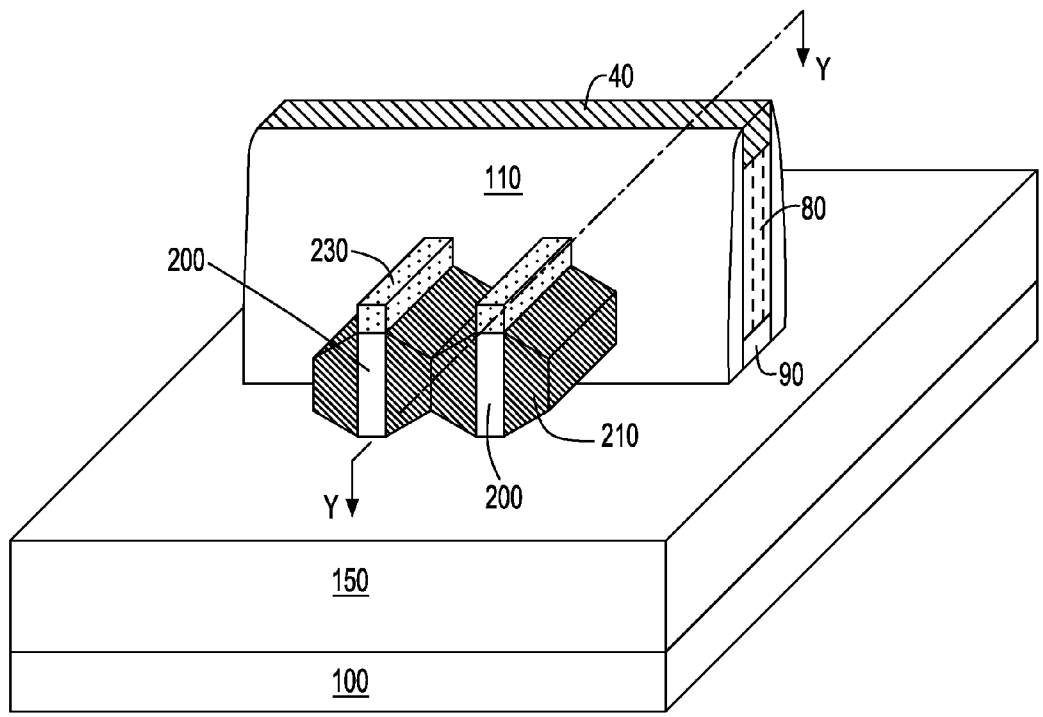
FIG. 9A is a perspective view depicting one embodiment of diffusing dopant from the in-situ doped semiconductor material into the fin structure to form extension regions, in accordance with the present invention.
Figure 9B:
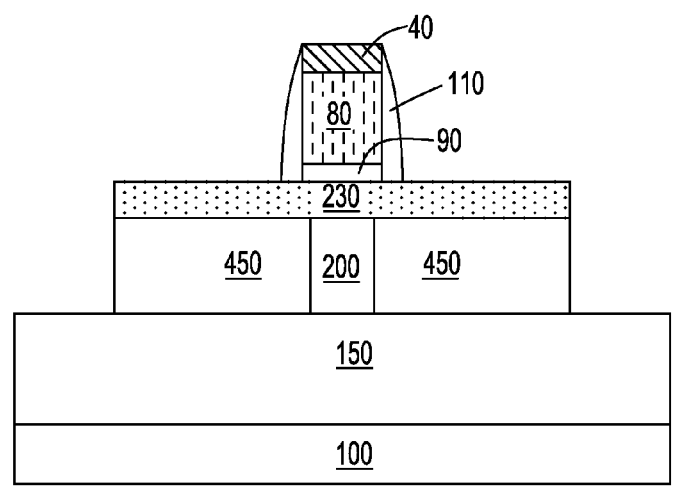
FIG. 9B is a side-cross sectional view along section line Y-Y of FIG. 9A.

FIGS. 9A and 9B depict one embodiment of diffusing dopant from the in-situ doped semiconductor material 210 into the fin structure 200 to form extension regions 450. In one embodiment, the dopant from the in-situ doped semiconductor material 210 is diffused into the fin structure 200 by an annealing processes including, but not limited to rapid thermal annealing, furnace annealing, flash lamp annealing or laser annealing. In one embodiment, thermal annealing to diffuse the dopant from the in-situ doped semiconductor material 210 into the fin structure 200 is conducted at a temperature ranging from about 850° C. to about 1350° C.

In one embodiment, in which in-situ doped semiconductor material 210 is doped to a p-type conductivity, the extension regions 450 that are formed in the fin structure 200 have a p-type conductivity. In another embodiment, in which the in-situ doped semiconductor material 210 is doped to an n-type conductivity, the extension regions 450 that are formed in the fin structure 200 have an n-type conductivity. Typically, the dopant concentration of the extension regions 450 ranges from $1\times10^{19}$ atoms/cm$^3$ to $5\times10^{21}$ atoms/cm$^3$. In another embodiment, the extension regions 450 have a dopant concentration ranging from $2\times10^{19}$ atoms/cm$^3$ to $2\times10^{20}$ atoms/cm$^3$.

Referring to FIGS. 9A and 9B, the above process may provide a finFET semiconductor device that includes a fin structure 200 having a width W2 of less than 10.0 nm. A gate structure 60 is present overlying a portion of the fin structure 200, in which a dielectric spacer 110 is present in direct contact with the gate structure 60. Doped epitaxial source and drain regions (in-situ doped semiconductor material 210) are present in direct contact with the sidewalls S1 of the fin structure 200 and in direct contact with the dielectric spacer 11. Extension diffusions 450 are present extending from the doped epitaxial source and drain regions 210 into the fin structure 200.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor device comprising:
   providing a substrate comprising at least a first semiconductor layer atop a dielectric layer, wherein the first semiconductor layer has a thickness of less than 10 nm;
   forming a gate structure directly on the first semiconductor layer;
   forming a spacer on the gate structure,
   forming an in-situ doped semiconductor material on the first semiconductor layer adjacent to the spacer on the gate structure, wherein the in-situ doped semiconductor material is in direct contact with an interface between a base of the spacer and the first semiconductor layer and the in-situ doped semiconductor material is not in contact with a sidewall of the spacer; and
   diffusing dopant from the in-situ doped semiconductor material into the first semiconductor layer to form extension regions.

2. The method of claim 1, wherein the substrate further comprises a second semiconductor layer separated from the first semiconductor layer by the dielectric layer.

3. The method of claim 1, wherein the first semiconductor layer has a thickness ranging from 1.0 nm to 5.0 nm.

4. The method of claim 1, wherein the forming of the in-situ doped semiconductor material comprises epitaxial growth of p-type doped SiGe.

5. The method of claim 4, wherein the p-type doped SiGe comprise a dopant concentration ranging from $1\times10^{19}$ atoms/cm$^3$ to $2\times10^{21}$ atoms/cm$^3$.

6. The method of claim 5, wherein a p-type dopant of the p-type doped SiGe comprises boron, aluminum, gallium or indium.

7. The method of claim 1, wherein the forming of the in-situ doped semiconductor material on the first semiconductor layer comprises epitaxial growth of n-type doped Si:C.

8. The method of claim 7, wherein the n-type doped Si:C comprises a dopant concentration ranging from $1\times10^{19}$ atoms/cm$^3$ to $2\times10^{21}$ atoms/cm$^3$.

9. The method of claim 8, wherein a n-type dopant of the n-type doped Si:C comprises antimony, arsenic or phosphorous.

10. The method of claim 1, wherein the diffusing dopant from the in-situ doped semiconductor material into the first semiconductor layer comprises annealing.

11. The method of claim 10, wherein the annealing comprises rapid thermal annealing, furnace annealing, flash lamp annealing or laser annealing.

12. The method of claim 1, wherein the in-situ doped semiconductor material provides raised source and drain regions.

13. A planar semiconductor device comprising:
   a substrate having a layer of semiconductor material atop an insulating layer, wherein the layer of semiconductor material has at thickness of less than 10.0 nm;
   a gate structure present on the layer of the semiconductor material;
   a spacer on the gate structure,
   doped epitaxial raised source and drain regions present atop the layer of semiconductor material on opposing sides of the gate structure, the doped epitaxial raised source and drain regions are in direct contact with an interface between a base of the spacer and the layer of semiconductor material, and the doped epitaxial raised source and drain regions are not in contact with a sidewall of the spacer; and
   extension diffusions extending from the doped epitaxial raised source and drain regions into the layer of semiconductor material.

* * * * *